(12) United States Patent
Chen et al.

(10) Patent No.: US 8,680,908 B2
(45) Date of Patent: Mar. 25, 2014

(54) ON-CHIP COARSE DELAY CALIBRATION

(75) Inventors: Wilson J. Chen, San Diego, CA (US); Chiew-Guan Tan, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 94 days.

(21) Appl. No.: 13/368,906

(22) Filed: Feb. 8, 2012

(65) Prior Publication Data

US 2013/0181759 A1     Jul. 18, 2013

Related U.S. Application Data

(60) Provisional application No. 61/587,705, filed on Jan. 18, 2012.

(51) Int. Cl.
*H03K 5/06*     (2006.01)

(52) U.S. Cl.
USPC ............................................ 327/277; 327/107

(58) Field of Classification Search
USPC .................. 327/105, 107, 276–278, 291, 298
See application file for complete search history.

(56) References Cited

U.S. PATENT DOCUMENTS

| 5,796,682 A | * | 8/1998 | Swapp | 368/120 |
| 6,166,821 A | * | 12/2000 | Blumer | 358/1.1 |

| 2006/0055574 A1 | 3/2006 | Maksimovic et al. |
| 2006/0273831 A1 | 12/2006 | Maksimovic et al. |
| 2008/0238752 A1 | 10/2008 | Shimizu et al. |

FOREIGN PATENT DOCUMENTS

JP     2011169594 A     9/2011

OTHER PUBLICATIONS

International Search Report and Written Opinion—PCT/US2013/021836—ISA/EPO—Apr. 9, 2013.

* cited by examiner

*Primary Examiner* — An Luu
(74) *Attorney, Agent, or Firm* — Sam Talpalatsky; Nicholas J. Pauley; Joseph Agusta

(57) ABSTRACT

Process, voltage and temperature corners of an on-chip device under calibration are obtained by comparing the outputs of different on-chip components such as active on-chip components and passive-on chip components in response to an input. A first on-chip delay line including a number of active devices, which generate an array of outputs D[ ]) at different stages of the delay. A second on-chip delay line generates a single output (CLK). A DFF array samples the array of outputs (D[ ]) with the single output clock CLK. The different delay variations in different process and temperature corners cause different outputs from the DFF array. The different outputs from the DFF array provide information about the process and temperature corner that can be for rapid calibration of the on-chip device under calibration within one cycle of the CLK.

19 Claims, 6 Drawing Sheets

_US 8,680,908 B2_

ON-CHIP COARSE DELAY CALIBRATION

CROSS REFERENCE TO RELATED APPLICATION

The present application claims the benefit of U.S. Provisional Patent Application No. 61/587,705 to Chen et al. filed on Jan. 18, 2012.

TECHNICAL FIELD

The present disclosure relates generally to semiconductor calibration circuits. More specifically, the present disclosure relates to providing compensation for local variations such as process variations, voltage variations, and temperature variations within a chip.

BACKGROUND

In semiconductor applications, a delay calibration of circuitry on a semiconductor package can offset process, voltage, and temperature (PVT) variations. Present calibration methods include off-chip components as well as external pins on the packages under calibration. In order to carry out a calibration process, some form of comparison is generally performed. For example, when an off-chip component is used for calibration, the off-chip component is usually used as a reference for comparison with on-chip components.

Because of continued rapid scaling of complementary metal oxide semiconductor (CMOS) technology, the use of off-chip components is becoming more expensive. Thus, off-chip components should be limited to applications relying on high accuracy of delay calibration.

SUMMARY

According to aspects of the present disclosure, calibration may be performed entirely on-chip without off-chip components. Instead, calibration is performed with two different types of on-chip components. The two different types of on-chip components include active devices such as metal oxide semiconductor field effect transistors (MOSFETs) and passive devices such as polysilicon (poly) resistors. A comparison of these devices shows different variation across different process and temperature corners (PT corners). Voltage variations can also be compensated for with multiple power supplies.

One aspect of the present disclosure provides a method of delay calibration of an on chip component including determining a delay difference between an active device and a passive device on a chip under calibration. Calibration of the on-chip component is based on the determined difference. In an illustrative configuration, the method includes configuring the on chip component to depend on actual variation between the active and passive device on the chip. The method of delay calibration according to aspects of the present disclosure is performed extremely quickly and efficiently. For example, the disclosed calibration process may be completed within a single cycle time. The disclosed calibration process may also be performed continuously without having to interrupt other processing tasks and without switching back and forth between the disclosed delay calibration process and other processing tasks.

Another aspect of the present disclosure provides an apparatus for wireless communication. According to this aspect of the disclosure, the apparatus includes means for determining a delay difference between a first delay line of passive devices on a chip under calibration and a second delay line of active devices on the chip under calibration. The apparatus also includes means for calibrating an on chip component based on the determined difference.

Another aspect of the present disclosure provides an apparatus for wireless communication including a D-flip-flop array, an on-chip active delay line coupled between an input and the D-flip-flop array, and an on-chip passive delay line coupled between the input and the D-flip-flop array. According to this aspect of the disclosure, the D-flip flop array is configured to generate a calibration code in response to a delay difference between the on chip active delay line and the on chip passive delay line.

This has outlined, rather broadly, the features and technical advantages of the present disclosure in order that the detailed description that follows may be better understood. Additional features and advantages of the disclosure will be described below. It should be appreciated by those skilled in the art that this disclosure may be readily utilized as a basis for modifying or designing other structures for carrying out the same purposes of the present disclosure. It should also be realized by those skilled in the art that such equivalent constructions do not depart from the teachings of the disclosure as set forth in the appended claims. The novel features, which are believed to be characteristic of the disclosure, both as to its organization and method of operation, together with further objects and advantages, will be better understood from the following description when considered in connection with the accompanying figures. It is to be expressly understood, however, that each of the figures is provided for the purpose of illustration and description only and is not intended as a definition of the limits of the present disclosure.

BRIEF DESCRIPTION OF THE DRAWINGS

The features, nature, and advantages of the present disclosure will become more apparent from the detailed description set forth below when taken in conjunction with the drawings in which like reference characters identify correspondingly throughout.

DETAILED DESCRIPTION

Different devices on a semiconductor chip may have very different process, voltage, and temperature variations. For example, the process and temperature variations of active on-chip components such as MOSFETs are generally very different from the process and temperature variations of a passive on-chip component such as a poly-resistor. Variations in the range of +/−60% can be seen in the performance metrics such as the saturation drive current (IDSAT) of on-chip active devices across different processes and voltages. In contrast, the variation in resistance of an on-chip passive resistor may only be in the range of about +/−20% for example. Because of the different process and temperature variations, information about the process and temperature corners of a device under calibration may be obtained by comparing the outputs of different on-chip components such as active on-chip components and passive-on chip components in response to an input.

Figure 1:
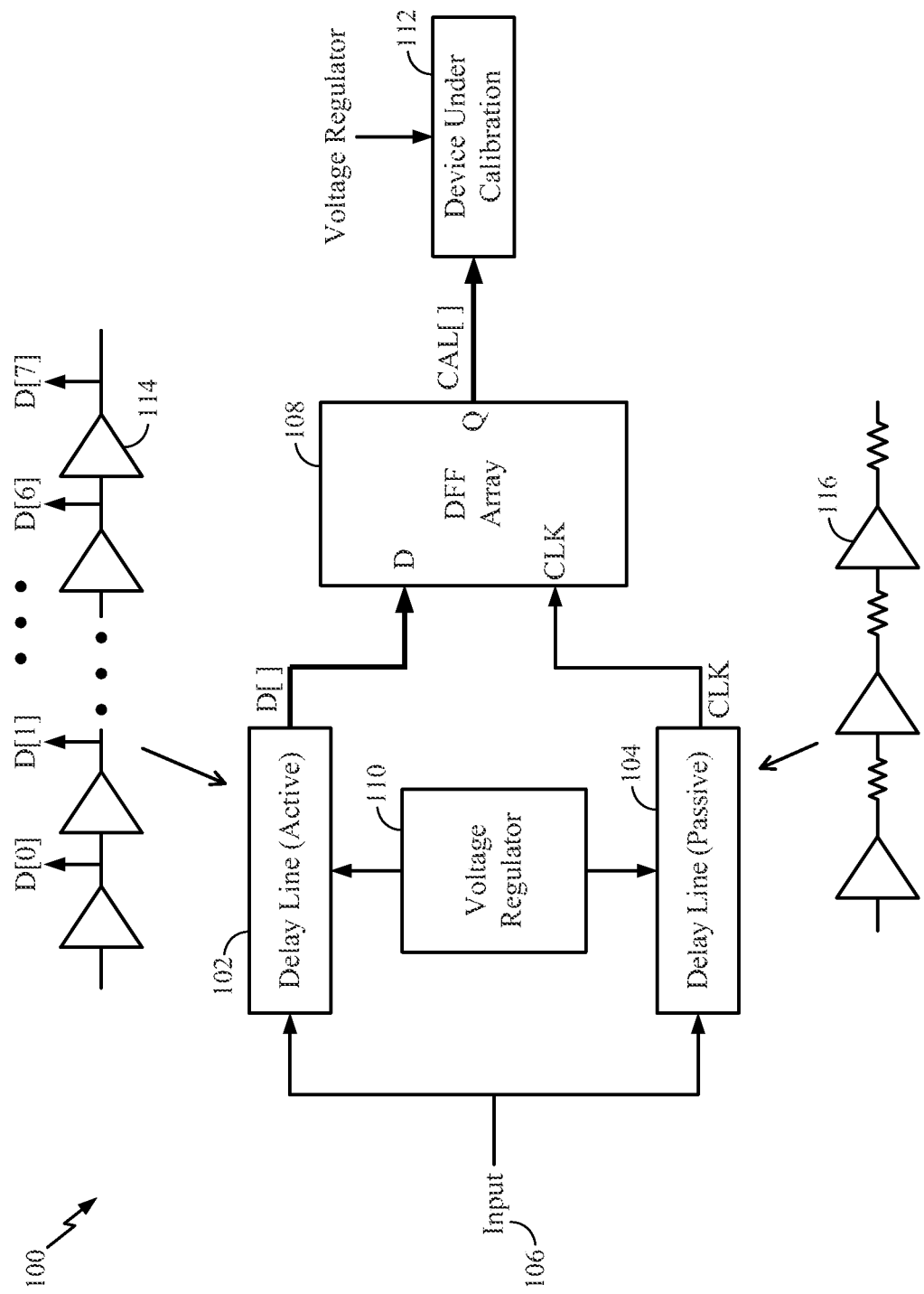
FIG. 1 is a schematic diagram conceptually illustrating a general example of calibration circuitry according to aspects of the present disclosure.

FIG. 1 shows a top level block diagram of a design architecture including circuitry 100 for performing on-chip calibration according to aspects of the present disclosure. The circuitry 100 includes a first delay line 102 and a second delay line 104 coupled between an input 106 and inputs to a D Flip Flop array (DFF array) 108. The first delay line 102 includes a number of active components 114 and the second delay line 104 includes a number of passive components 116. A voltage regulator 110 is coupled between the first delay line 102 and the second delay line 104. A device under calibration 112 is coupled to an output of the DFF array 108.

An input signal (either rising or falling edge, for example) is fed into both the first delay line 102 the second delay line 104. The delay of the first delay line 102 is dominated by active devices (e.g., inverters) and the delay of the second delay line 104 is dominated by passive devices (e.g., poly resistors). Both delay lines are powered by the voltage regulator 110 to reduce variation on their power supply. If voltage variation is also to be compensated for, a separate power supply is coupled to each delay line 102, 104.

The first delay line 102 generates an array of outputs D[0], D[1], . . . D[7], D[7] from different stages of the first delay line. The second delay line 104 only generates a single output (CLK) with its delay. For each input 106, the timing of the array of outputs D[ ] generated by the first delay line 102 and the timing of the CLK output from the second delay line 104 depends on the process, temperature and voltage. The array of outputs D[0] varies based on on-chip active component variations. The CLK output varies based on on-chip passive component variations. Differences between active component variation and passive component variation for different process, temperature and voltage conditions can be seen by comparing the CLK output with the array of outputs D[ ] under the different conditions. According to aspects of the present disclosure, the difference between the CLK output and the array of outputs D[ ] can be used to generate a code that indicates the process, temperature and voltage conditions for calibration purposes.

Figure 2:
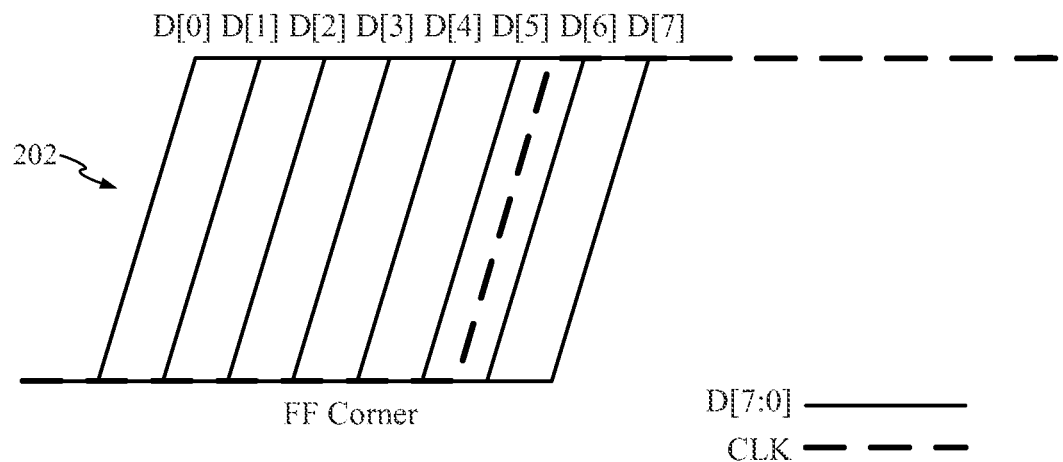
FIG. 2 is a signal timing, diagram illustrating differences between a passive delay and an active delay for calibration according to an aspect of the present disclosure.
Figure 2:
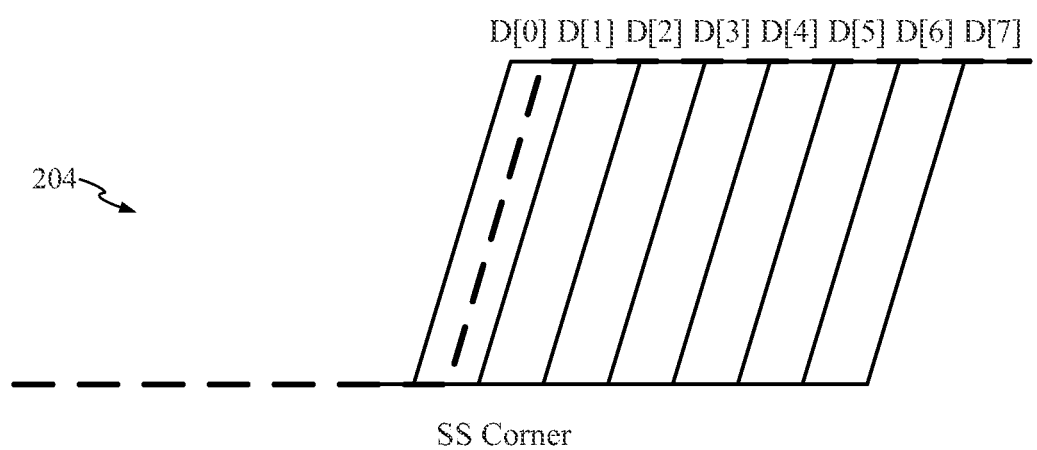

FIG. 2 shows a difference between the output of the first delay line 102 and the second delay line 104 that may be used for coarse calibration in two different cases. Outputs from the first delay line 102 and the second delay line 104 in a fast-fast (FF) process corner are shown in a first case, 202. In the first case, 202, the delay of the active delay line in the FF corner is smaller than the delay of the passive line in the FF corner. In this case, the DFF array 108 sense six outputs (D[0] . . . D[5]) from the first delay line 102 before the DFF array 108 receives the CLK output from the second delay line 104. The six outputs are latched in the DFF array 108 in response to the CLK. The latched outputs provide an encoded representation of the difference between active component delay and passive component delay in the FF process corner.

Outputs from the first delay line 102 and the second delay line 104 in a slow-slow (SS) process corner are shown in a second case, 204. In the second case, 204, the delay of the active delay line in the SS corner is longer smaller than the delay of the passive line in the SS corner. In this case, the DFF array 108 senses only one output (D[0]) from the first delay line 102 before the DFF array 108 receives the CLK output from the second delay line 104. The single outputs (D[0]) are latched in the DFF array 108 in response to the CLK. The latched outputs provide an encoded representation of the difference between active component delay and passive component delay in the SS process corner.

In one configuration, an apparatus for wireless communication includes means for determining a delay difference between a first delay line of passive devices on a chip under calibration and a second delay line of active devices on the chip under calibration; and means for calibrating an on chip component based on the determined difference. The means for determining a delay difference and means for calibrating the on chip component may be the DFF array 108 for example. In another configuration, the aforementioned means may be any module or any apparatus configured to perform the functions recited by the aforementioned means. Although specific means have been set forth, it will be appreciated by those skilled in the art that not all of the disclosed means are required to practice the disclosed configurations. Moreover, certain well known means have not been described, to maintain focus on the disclosure.

The apparatus 100 generates a calibration code extremely quickly and efficiently. For example, the apparatus 106 is configured to receive an input and to generate a calibration code within a single cycle time of the input.

According to aspects of the present disclosure, the apparatus 100 may perform the disclosed delay calibration process continuously. This allows calibration to be performed even more efficiently without having to interrupt other processing tasks and without switching back and forth between the disclosed delay calibration process and other processing tasks.

Figure 3:
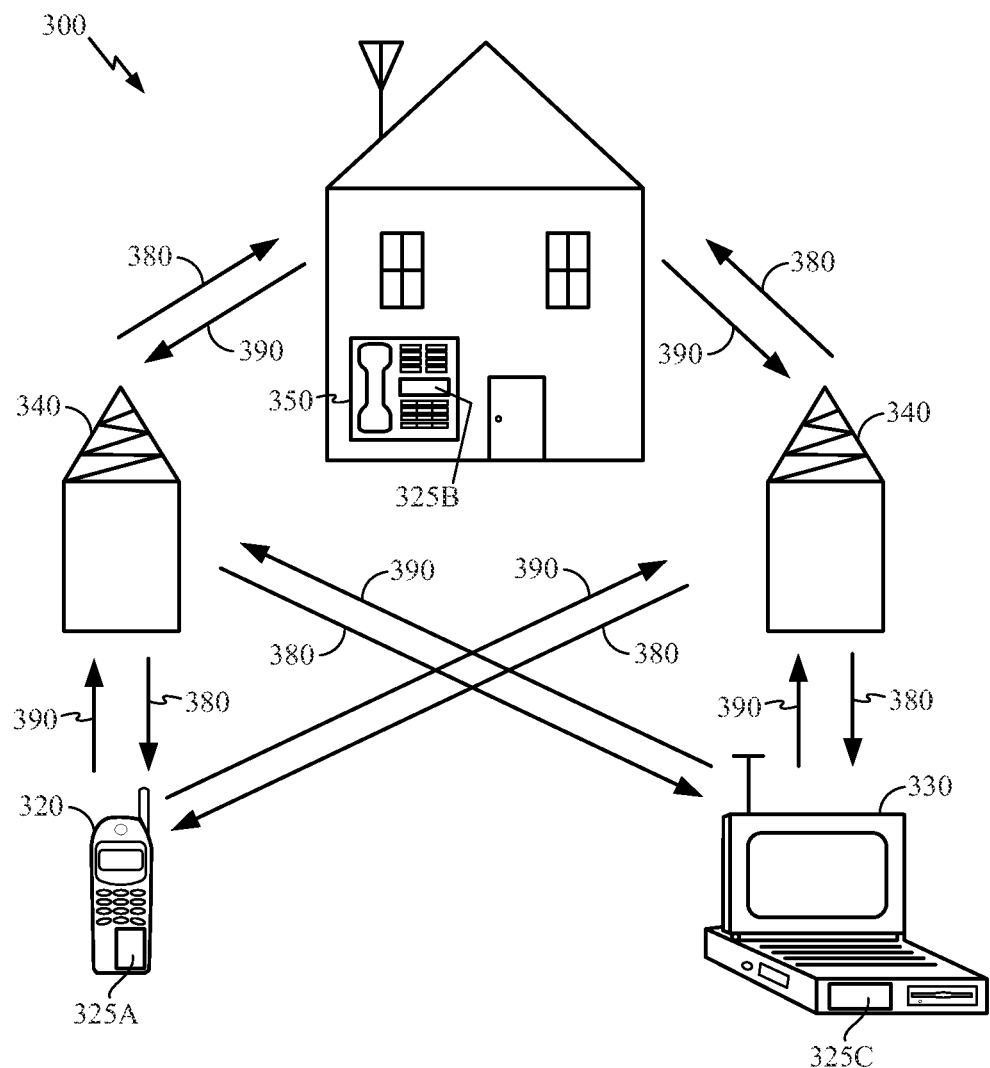
FIG. 3 shows an exemplary wireless communication system in which a configuration of the disclosure may be advantageously employed.

FIG. 3 shows an exemplary wireless communication system 300 in which a configuration of the disclosed calibration method may be advantageously employed. For purposes of illustration. FIG. 3 shows three remote units 320, 330, and 350 and two base stations 340. It will be recognized that wireless communication systems may have many more remote units and base stations. Remote units 320, 330, and 350 include the calibration circuitry 325A, 325B, and 325C, respectively. FIG. 3 shows forward link signals 380 from the base stations 340 and the remote units 320, 330, and 350 and reverse signals 390 from the remote units 320, 330, and 350 to base stations 340.

In FIG. 3, the remote unit 320 is shown as a mobile telephone, remote unit 330 is shown as a portable computer, and remote unit 350 is shown as a fixed location remote unit in a wireless local loop system. For example, the remote units may be cell phones, hand-held personal communication systems (PCS) units, portable data units such as personal data assistants, or fixed location data units such as meter reading equipment. Although FIG. 3 illustrates remote units, which may employ calibration circuitry according to the teachings of the disclosure, the disclosure is not limited to these exemplary illustrated units. For instance, calibration circuitry according to configurations of the present disclosure may be suitably employed in any device.

Figure 4:
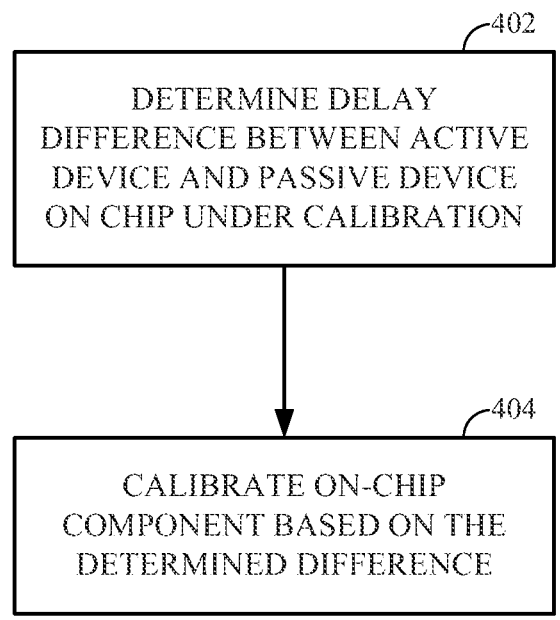
FIG. 4 is a process flow diagram illustrating a method for calibration according to an aspect of the present disclosure.

A method for of delay calibration according to aspects of the present disclosure is described with reference to FIG. 4. In block 402, a delay difference between an active device (delay line) and a passive device on a chip wider calibration is determined. In block 404, an on-chip component is calibrated based on the determined difference.

The calibration outcome depends on the difference between active and passive devices. This design performs extremely well if the variation of these two types of device are almost perfectly correlated in the chip substrate material, e.g., silicon. However, it can not be assumed that the variation of these devices is almost perfectly correlated because their manufacture, materials and process are somewhat different. On the other hand, the variations of these devices are also not completely independent of each other because both types of devices share similar structures such as polysilicon, for example. As a result of the imperfect correlation, accuracy of the calibration results can be impacted. To reduce this impact, according to aspects of the present disclosure, the components to be calibrated can be designed based on the differences of active and passive devices so that impact from the imperfect correlations can be cancelled out.

Figure 5:
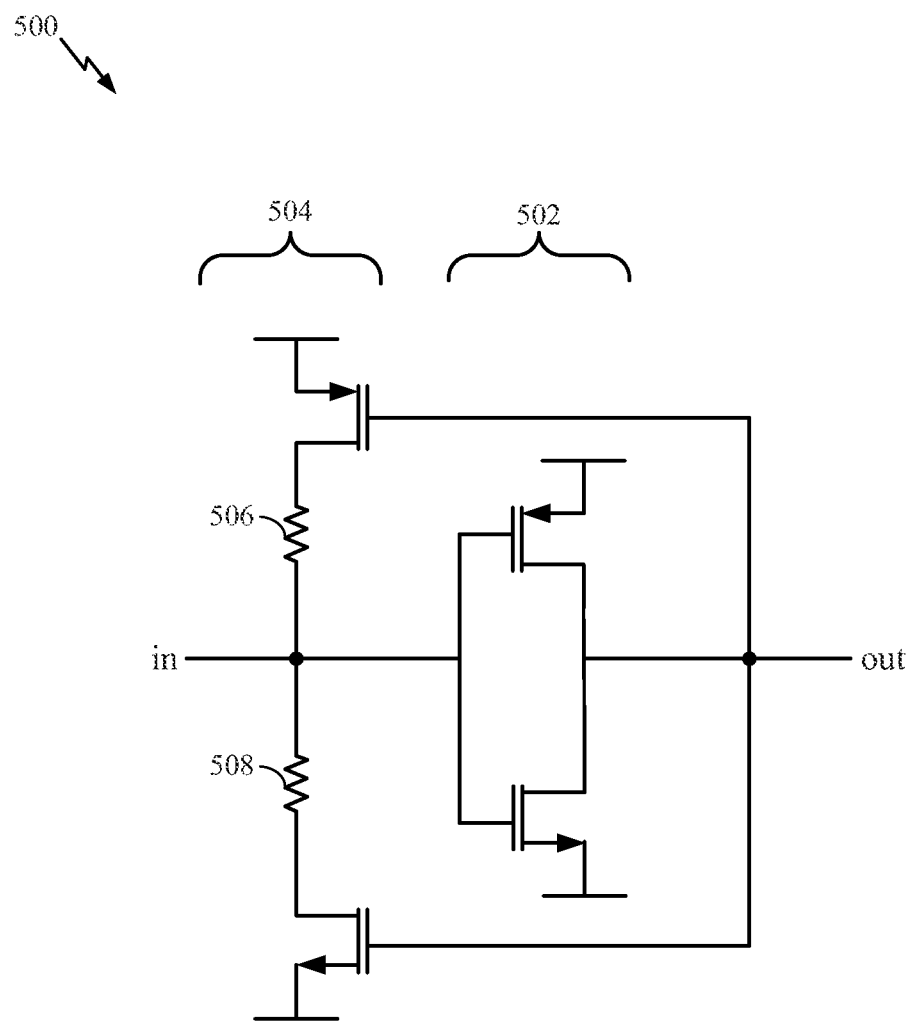
FIG. 5 is a schematic diagrams conceptually illustrating ring oscillator circuitry in which a configuration of the disclosure ma be advantageously employed.

In one example, a ring oscillator to be calibrated can be designed to have its oscillation frequency depend on the differences between the delay of active and passive devices so that the impact from the imperfect correlation can be canceled out. A ring oscillator generally includes an odd number of inverter stages. FIG. 5 shows an exemplary design of a single stage inuring oscillator 500. The ring oscillator 500 includes inverter circuitry 502 and keeper circuitry 504. The keeper circuitry 504 includes resistors 506, 508. According to aspects of the present disclosure, the ring oscillator 500 is designed to oscillate at around a desired frequency at the three primary process corners, i.e., the slow-stow (SS), the typical-typical (TT) corner and the fast-fast (FF) corners.

Device models that are used for designing and analyzing circuitry such as the ring oscillator 500 generally assume that passive and active devices have perfect correlation. However, on an actual chip, the properties of the active and passive devices are not precisely the same as they are in the device models and do not have perfect correlation. For example, in an FF process corner, a passive resistor on a chip might be more resistive than a corresponding device model had predicted for the FF process corner. The larger than predicted difference between the passive and active devices could change the resulting calibration code and attempt to turn off additional legs in the oscillator and slow it down. However, because the effect of the keeper circuitry 504 is mainly determined by the passive resistors 506, 508, its increased resistance causes weaker keeper functionality. This tends to speed up the oscillator frequency of the ring oscillator 500 and opposes the affect of the larger than predicted difference in resistance of the passive device. In other words, the keeper circuitry 504 is designed to offset the effect from the imperfect correlation and maintain the accuracy of the calibration results.

Although specific circuitry has been set forth, it will be appreciated by those skilled in the art that not all of the disclosed circuitry is required to practice the disclosed configurations. Moreover, certain well known circuits have not been described, to maintain focus on the disclosure.

Figure 6:
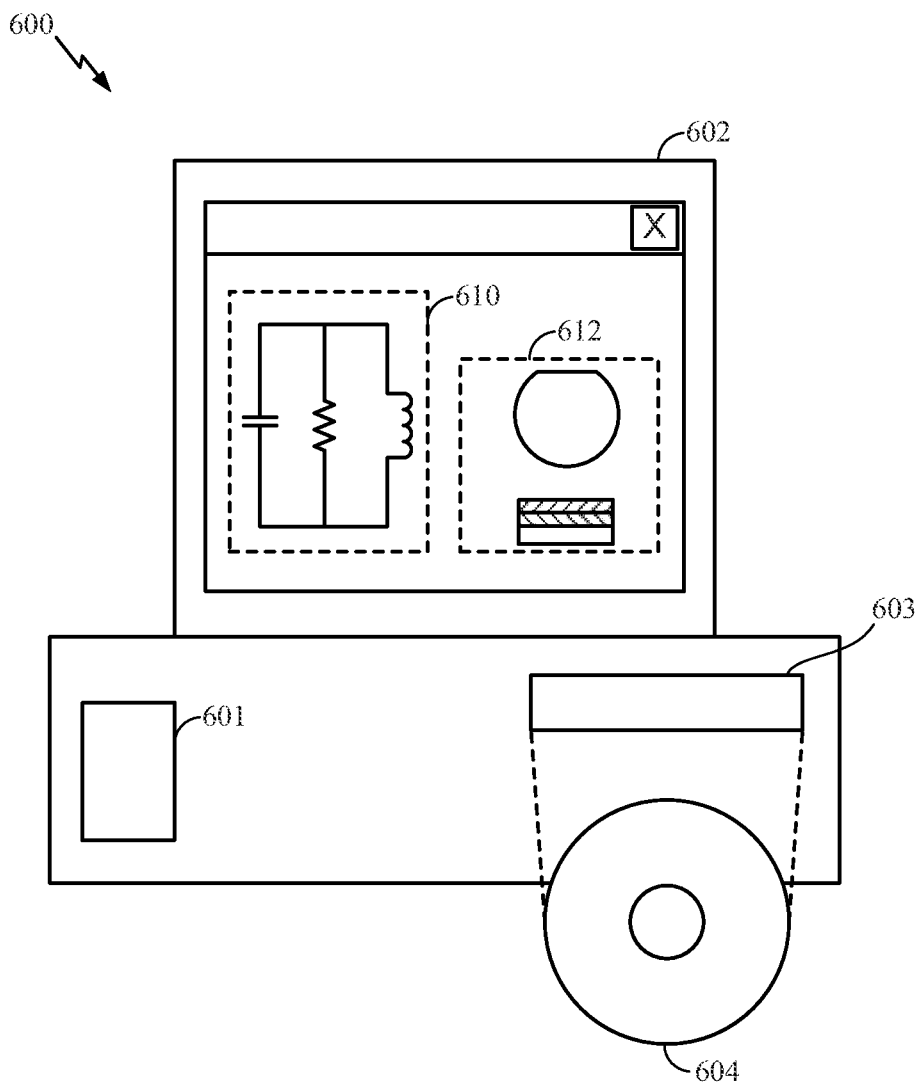
FIG. 6 is a block diagram illustrating a design workstation for circuit, layout, and logic design of a semiconductor component according to one aspect of the present disclosure.

FIG. 6 is a block diagram illustrating a design workstation used for circuit, layout, and logic design of a semiconductor component, such as the calibration circuitry disclosed above. A design workstation 600 includes a hard disk 601 containing operating system software, support files, and design software such as Cadence or OrCAD. The design workstation 600 also includes a display 602 to facilitate design of a circuit 610 or a semiconductor component 612 such as the calibration circuitry. A storage medium 604 is provided for tangibly storing the circuit design 610 or the semiconductor component 612. The circuit design 610 or the semiconductor component 612 may be stored on the storage medium 604 in a file format such as GDSII or GERBER. The storage medium 604 may be a CD-ROM, DVD, hard disk, flash memory, or other appropriate device. Furthermore, the design workstation 600 includes a drive apparatus 603 for accepting input from or writing output to the storage medium 604.

Data recorded on the storage medium 604 may specify logic circuit configurations, pattern data for photolithography masks, or mask pattern data for serial write tools such as electron beam lithography. The data may further include logic verification data such as timing diagrams or net circuits associated with logic simulations. Providing data on the storage medium 604 facilitates the design of the circuit design 610 or the semiconductor component 612 by decreasing the number of processes for designing semiconductor wafers.

For a firmware and/or software implementation, the methodologies may be implemented with modules (e.g., procedures, functions, and so on) that perform the functions described herein. A machine-readable medium tangibly embodying instructions may be used in implementing the methodologies described herein. For example, software codes may be stored in a memory and executed by a processor unit. Memory may be implemented within the processor unit or external to the processor unit. As used herein the term "memory" refers to types of long term, short term, volatile, nonvolatile, or other memory and is not to be limited to a particular type of memory or number of memories, or type of media upon which memory is stored.

If implemented in firmware and/or software, the functions may be stored as one or more instructions or code on a computer-readable medium. Examples include computer-readable media encoded with a data structure and computer-readable media encoded with a computer program. Computer-readable media includes physical computer storage media. A storage medium may be an available medium that can be accessed by a computer. By way of example, and not limitation, such computer-readable media can include RAM, ROM, EEPROM, CD-ROM or other optical disk storage, magnetic disk storage or other magnetic storage devices, or other medium that can be used to store desired program code in the form of instructions or data structures and that can be accessed by a computer; disk and disc, as used herein, includes compact disc (CD), laser disc, optical disc, digital versatile disc (DVD), floppy disk and blu-ray disc where disks usually reproduce data magnetically, while discs reproduce data optically with lasers. Combinations of the above should also be included within the scope of computer-readable media.

In addition to storage on computer readable medium, instructions and/or data may be provided as signals on transmission media included in a communication apparatus. For example, a communication apparatus may include a transceiver having signals indicative of instructions and data. The instructions and data are configured to cause one or more processors to implement the functions outlined in the claims.

Although the present disclosure and its advantages have been described in detail, it should be understood that various changes, substitutions and alterations can be made herein without departing from the spirit and scope of the disclosure as defined by the appended claims. Moreover, the scope of the present application is not intended to be limited to the particular configurations of the process, machine, manufacture, composition of matter, means, methods and steps described in the specification. As one of ordinary skill in the art will readily appreciate from the disclosure of the present disclosure, processes, machines, manufacture, compositions of matter, means, methods, or steps, presently existing or later to be developed that perform substantially the same function or achieve substantially the same result as the corresponding configurations described herein may be utilized according to the present disclosure. Accordingly, the appended claims are intended to include within their scope such processes, machines, manufacture, compositions of matter, means, methods, or steps.

What is claimed is:

1. A method of delay calibration, comprising:
   determining a delay difference between a first delay line including predominantly passive devices on a chip under calibration and a second delay line including predominantly active devices on the chip under calibration;
   calibrating an on-chip component based on the determined difference; and
   receiving a same phase input at both the first delay line and the second delay line before determining the delay difference.

2. The method of claim 1, further comprising:
   configuring the on-chip component to depend on actual variation between the active devices and the passive devices on the chip.

3. The method of claim 1, further comprising:
   supplying a common power to the first delay line and the second delay line.

4. The method of claim 1, further comprising:
   supplying a first power to the first delay line and a second power to the second delay line.

5. The method of claim 4, in which one of the first power and the second power is a constant reference power.

6. The method of claim 1, further comprising integrating the chip under calibration into at least one of a mobile phone, a set top box, a music player, a video player, an entertainment unit, a navigation device, a computer, a hand-held personal communication systems (PCS) unit, a portable data unit, and a fixed location data unit.

7. An apparatus for wireless communication comprising:
   means for determining a delay difference between a first delay line including predominantly passive devices on a chip under calibration and a second delay line including predominantly active devices on the chip under calibration;
   means for calibrating an on-chip component based on the determined difference; and
   means for receiving a same phase input at both the first delay line and the second delay line before determining the delay difference.

8. The apparatus of claim 7, further comprising:
   means for supplying a common power to the first delay line and the second delay line.

9. The apparatus of claim 7, further comprising:
   means for supplying a first power to the first delay line; and
   means for supplying a second power to the second delay line.

10. The apparatus of claim 7, integrated in at least one of a mobile phone, a set top box, a music player, a video player, an entertainment unit, a navigation device, a computer, a hand-held personal communication systems (PCS) unit, a portable data unit, and a fixed location data unit.

11. An apparatus for wireless communication comprising:
    a D-flip-flop array;
    an on-chip active delay line coupled between an input and the D-flip-flop array; and
    an on-chip passive delay line coupled between the input and the D-flip-flop array, the input comprising a same phase input to both the on-chip active delay line and the on-chip passive delay line;
    the D-flip flop array being configured to determine a delay difference between the on-chip active delay line including predominantly active devices and the on-chip passive delay line including predominantly passive devices in response to the same phase input and to generate a calibration code in response to the delay difference.

12. The apparatus of claim 11, further comprising:
    a first power supply configured for supplying a common power to the first delay line and the second delay line.

13. The apparatus of claim 11, further comprising:
    a first power supply configured for supplying a first power to the first delay line; and
    a second power supply configured for supplying a second power to the second delay line.

14. The apparatus of claim 11, integrated in at least one of a mobile phone, a set top box, a music player, a video player, an entertainment unit, a navigation device, a computer, a hand-held personal communication systems (PCS) unit, a portable data unit, and a fixed location data unit.

15. A computer program product for wireless communications in a wireless network, comprising:
    a non-transitory computer-readable medium having program code recorded thereon, the program code comprising:
    program code to determine a delay difference between a first delay line including predominantly passive devices on a chip under calibration and a second delay line including predominantly active devices on the chip under calibration in response to a same phase input to the first delay line and the second delay line; and
    program code to calibrate an on-chip component based on the determined difference.

16. The computer program product of claim 15, integrated in at least one of a mobile phone, a set top box, a music player, a video player, an entertainment unit, a navigation device, a computer, a hand-held personal communication systems (PCS) unit, a portable data unit, and a fixed location data unit.

17. A method of delay calibration, comprising steps of:
    determining a delay difference between a first delay line including predominantly passive devices on a chip under calibration and a second delay line including predominantly active devices on the chip under calibration;
    calibrating an on-chip component based on the determined difference; and
    receiving a same phase input at both the first delay line and the second delay line before determining the delay difference.

18. The method of claim 17, further comprising a step of:
    configuring the on-chip component to depend on actual variation between the active devices and the passive devices on the chip.

19. The method of claim 17, further comprising a step of integrating the chip under calibration into at least one of a mobile phone, a set top box, a music player, a video player, an entertainment unit, a navigation device, a computer, a hand-held personal communication systems (PCS) unit, a portable data unit, and a fixed location data unit.

* * * * *